United States Patent
Verschuuren

(10) Patent No.: US 11,619,878 B2
(45) Date of Patent: Apr. 4, 2023

(54) METHOD FOR MAKING RELIEF LAYER

(71) Applicant: KONINKLIJKE PHILIPS N.V., Eindhoven (NL)

(72) Inventor: Marcus Antonius Verschuuren, Berkel-Enschot (NL)

(73) Assignee: Koninklijke Philips N.V., Eindhoven (NL)

( * ) Notice: Subject to any disclaimer, the term of this patent is extended or adjusted under 35 U.S.C. 154(b) by 225 days.

(21) Appl. No.: 17/020,896

(22) Filed: Sep. 15, 2020

(65) Prior Publication Data

US 2020/0409257 A1 Dec. 31, 2020

Related U.S. Application Data

(60) Continuation of application No. 14/968,127, filed on Dec. 14, 2015, now abandoned, which is a division of application No. 12/447,536, filed as application No. PCT/IB2007/054361 on Oct. 26, 2007, now Pat. No. 9,298,086.

(30) Foreign Application Priority Data

Nov. 1, 2006 (EP) .................... 06123325

(51) Int. Cl.
*G03F 7/00* (2006.01)
*B82Y 10/00* (2011.01)
*B82Y 40/00* (2011.01)
*B29C 59/02* (2006.01)

(52) U.S. Cl.
CPC ............ *G03F 7/0002* (2013.01); *B82Y 10/00* (2013.01); *B82Y 40/00* (2013.01); *B29C 2059/023* (2013.01); *Y10T 428/24479* (2015.01)

(58) Field of Classification Search
CPC ... B29C 2059/023; B82Y 10/00; B82Y 40/00; G03F 7/0002; Y10T 428/24479
See application file for complete search history.

(56) References Cited

U.S. PATENT DOCUMENTS

| | | | |
|---|---|---|---|
| 4,238,590 A | 12/1980 | Scholze | |
| 4,243,692 A | 1/1981 | Scholze | |
| 6,974,643 B2 | 12/2005 | Kurataka | |
| (Continued) | | | |

FOREIGN PATENT DOCUMENTS

| | | | |
|---|---|---|---|
| CN | 1697865 A | 11/2005 | |
| CN | 1752165 A | 3/2006 | |
| (Continued) | | | |

OTHER PUBLICATIONS

Machine translation of CN 1752165; ZHANG, Chongzhao, Mar. 29, 2006 (Year: 2006).*

(Continued)

*Primary Examiner* — Frances Tischler

(57) ABSTRACT

A method for forming a relief layer employing a stamp having a stamping surface including a template relief pattern. A solution comprising a siliconoxide compound is sandwiched between a substrate surface and the stamp surface and dried while sandwiched. After removal of the template relief pattern the relief layer obtained has a high inorganic mass content making it robust and directly usable for a number of applications such as semiconductor, optical or micromechanical.

20 Claims, 8 Drawing Sheets

(56) References Cited

U.S. PATENT DOCUMENTS

| | | |
|---|---|---|
| 2001/0053447 A1 | 12/2001 | Takano |
| 2004/0026832 A1 | 2/2004 | Gier |
| 2004/0261981 A1 | 12/2004 | McCoy et al. |
| 2004/0264019 A1 | 12/2004 | Curtiss et al. |
| 2005/0230882 A1 | 10/2005 | Watts et al. |
| 2006/0055310 A1 | 3/2006 | Vink |
| 2006/0081557 A1 | 4/2006 | Xu |

FOREIGN PATENT DOCUMENTS

| | | |
|---|---|---|
| JP | 11314927 A | 11/1999 |
| JP | 2000191966 A | 7/2000 |
| JP | 2004314238 A | 11/2004 |
| JP | 2005053006 A | 3/2005 |
| JP | 2006287192 A | 10/2006 |
| WO | 9325604 A1 | 12/1993 |
| WO | 9531413 A1 | 11/1995 |
| WO | 2005101466 A2 | 10/2005 |
| WO | 2006044690 A2 | 4/2006 |
| WO | 2006051017 A1 | 5/2006 |
| WO | 2007027276 A1 | 3/2007 |
| WO | 2007029542 A1 | 3/2007 |

OTHER PUBLICATIONS

Shimojima Atsushi et al., "Synthesis of oriented inorganic-Organic noncomposite films from alkyltrialkoxsilane-tetraalkoxsilane mixtures" Journal of teh American Chemistry Society 120.18 (Apr. 1998): 4528-4529.

Fujii, K. et al. "Synthesis of 2-dimensional inorganic/organic hybrid polymers: Novel meltable layered alkylsiloxanes." Journal of materials science letters 22.20 (Oct. 2003): 1459-1461.

Verschuuren, Marc et al. "3D photonic structures by sol-gel imprint lithography." MRS Proceedings. vol. 1002, Cambridge University Press, May 2007.

Lee Jessamine Ng et al. "Solvent compatability of poly (dimethylsiloxane)-based microfluidic devices." Analytical chemistry 75.23 (Oct. 2003): 6544-6554.

Hua Dong, Organic-Inorganic Hybrid Mesoporous Silica Material and Their Application as Host Matrix for Protein Molecules, Drexel University, Mar. 2002.

\* cited by examiner

METHOD FOR MAKING RELIEF LAYER

CROSS-REFERENCE TO RELATED APPLICATIONS

This patent application is a continuation of U.S. patent application Ser. No. 14/968,127, filed Dec. 14, 2015, which is a divisional of U.S. patent application Ser. No. 12/447, 536, filed Apr. 28, 2009, which claims benefit under 35 U.S.C. § 371 of International Application No. PCT/IB2007/ 054361 filed on Oct. 26, 2007, which claims the foreign priority to European Patent Application No EP06123325.0 filed on Nov. 1, 2006.

FIELD OF THE INVENTION

The invention relates to a Method for forming a relief layer employing a stamp having a stamping surface including a template relief pattern. The invention also relates to a relief layer as prepared by the method and the use of such a relief layer in semiconductor, optical and micromechanical devices.

BACKGROUND OF THE INVENTION

Providing material layers having a relief pattern can be done using an embossing or imprinting method such as imprinting lithography. In US 2004/0264019 A1 an exemplary method is disclosed. In the method, a relatively soft sol-gel layer is provided to a hard surfaced substrate and subjected to an embossing method for forming a pattern in the surface of the layer. To this end a stamp having a stamping surface including the complementary pattern of the desired pattern is used to emboss, i.e. to mold the desired pattern in the upper surface of the relatively soft sol-gel layer.

It is further disclosed that a suitable sol-gel solution for providing the sol-gel layer using for example spincoating in the aforementioned method may be prepared by mixing an alkoxide, e.g. a tetraalkoxysilane such as tetraethoxysilane (TEOS) or tetramethoxysilane (TMOS), water and nitric acid at molar ratios of TEOS or TMOS/water/nitric acid of 1/4-30/>0.05. The nitric acid acts as a catalyst for conversion of the TEOS or TMOS to a siliconoxide sol, which is a siliconoxide compound. After completion of the reaction butanol is added as a drying and retardation agent at molar ratios of TEOS or TMOS/water/nitric acid/butanol of 1/4-30/0.05/>4.

The spincoating process effects removal, by for example evaporation, of a portion of the solvent from the initially applied sol-gel solution. The resultant, partially dried sol-gel layer is porous and glass-like, principally comprised of silica molecular clusters together with the various solvents still present in the micropores.

It is a problem of the method described that the partially dried sol-gel layer is glass-like resulting in problematic embossing and that the resulting relief layer is porous.

SUMMARY OF THE INVENTION

It is an object of the invention to provide a relief layer with low porosity which can be adequately prepared by an embossing method.

The invention is defined by the independent claims. The dependent claims define advantageous embodiments.

In a first aspect of the invention the object is achieved by providing a method according to claim 1.

The invention for solving the problem is based on the following findings and considerations. The relief layer to be prepared must have low porosity in order to be applicable in for example functional layers of devices or as etch masks in manufacturing processes. It was considered that this can be achieved by having a high inorganic mass content within the layer to be embossed. This requires the partially dried siliconoxide compound layer to have a high concentration of the siliconoxide compound. Furthermore, the siliconoxide compound must have a high degree of inorganic crosslinking, i.e. a high degree of Si—O—Si chemical bonding during embossing. This prevents having to extrude organic substances during embossing or after, giving lower porosity in the final relief layer. These requirements however cause the partially dried siliconoxide compound layer to form a highly viscous solution. Therewith causing the layer to become not patternable especially with flexible or brittle stamps.

The method of the invention combines a siliconoxide compound having a composition that solves these issues simultaneously. Thus, the method provides a siliconoxide compound that has a degree of Si—O—Si chemical crosslinking suitable for obtaining the desired high mass content and viscosity, wherein the degree of crosslinking is controlled by adding siliconoxide precursor compound that has only three in stead of four valencies for forming inorganic crosslinks. The resulting siliconoxide compound has a high solubility in the partially dried siliconoxide compound layer, while still allowing embossing of the layer therewith molding the layer according to the template relief layer to result in the layer to adapt the complementary relief layer in an adequate way. Hence, the method results in a relief layer having the desired properties.

It is a further advantage of the method that solidification is achieved during sandwiching by further drying of the layer, i.e. removing the solvent and additional reaction products that are formed by additional Si—O—Si crosslinking initiated during further drying. Hence no additional curing step needs to be employed for solidification of the embossed layer during the sandwiching.

The drying time is advantageously shortened within the method since inorganic crosslinking within the siliconoxide compound is already high. Hence the time needed to reach a crosslinking degree to form a solidified siliconoxide layer is shortened. The degree of Si—O—Si crosslinking and therewith the extent of network formation is controlled by adding a siliconoxide compound precursor that comprises silicon atoms being chemically bound to three oxygen atoms and one atom different from oxygen, the chemical bond between the silicon atoms and the one atom different from oxygen being chemically inert during the method. Therewith, the siliconoxide compound precursor has one valency less for forming Si—O—Si chemical bonds than the siliconoxide compound precursor having silicon atoms chemically bound to four oxygen atoms. This alters the crosslinking to obtain the desired effect.

In an embodiment of the method the siliconoxide compound comprises nanoparticles. With nanoparticles are meant particles having an average diameter smaller than 200 nm. In any case the particles meant can form a stable siliconoxide compound in the form of a sol as in a sol-gel solution. It is an advantage to use nanoparticles in the method since it provides inorganic mass content to be used for building the relief layer to the siliconoxide solution which mass content can be dissolved in a solvent leading to a siliconoxide compound solution that is formable enough for embossing, comprises the inorganic chemical structure to be desired within the relief layer to a substantial extent already and therefore does not require substantial reaction to transform the compound during the sandwiching step and still allows relief pattern formation at small dimension. The smaller the average diameter of the particles the smaller the features with a relief pattern can be made.

A further advantage of the nanoparticles is that they have a core that does not participate in the chemistry involved during the method of embossing. Hence, the core may be chemically or physically modified to perform functions without interfering with the chemistry of the embossing method. Thus, the nanoparticles and therewith the siliconoxide compound may comprise siliconoxide in any form available being for example crystalline or amorphous. They may further comprise siliconoxide modified with organic chemical groups or surface chemical groups. The siliconoxide may be mixed with other materials being organic or inorganic materials. The inorganic materials may include for example aluminiumoxide, zirconiumoxide, titaniumoxide cadmiumsulfide, cadmiumtelluride. The siliconoxide of the nanoparticles may comprise materials having specific optical, electro-optical, electrical or magnetic properties. They may for example provide coloring. The nanoparticles having inorganic materials may provide both the high mass content and an electronic and/or optical function.

In an embodiment of the method the siliconoxide compound solution is prepared by mixing a siliconoxide compound precursor and at least one mono-functionalized trialkoxysilane, the mixture being reacted with a solution of acid in water to form the siliconoxide compound. The trialkoxysilane prevents extensive hydrolysis and condensation, because it participates in the hydrolysis and condensation reactions only with the three silicon valencies bearing the alkoxy-groups. This is advantageous since if network formation through extensive inorganic Si—O—Si crosslinking is favored, the trialkoxysilane makes the network less dense, therewith providing an advantageous compromise between substantial Si—O—Si crosslinking in the siliconoxide compound preferred for creating high inorganic mass content in the solution and the solubility (and flexibility of the inorganic network) of the siliconoxide compound in the solvent.

In an advantageous embodiment the siliconoxide compound precursor is a tetraalkoxysilane. The tetraalkoxysilane reacts with all four valencies of the silicon atom to form Si—O—Si crosslinks or chemical bonds. Hence, Si atoms stemming from this precursor do not increase the organic content relative to the inorganic content within the siliconoxide compound and/or the silicon oxide relief layer to be prepared.

In an advantageous embodiment at least one of the alkoxy-groups of the teraalkoxysilane is identical to at least one of the alkoxy-groups of the at least one mono-functionalized trialkoxysilane. The reactivity of a chemical bond between a silicon atom and an oxygen atom of an alkoxy-group and therewith the rate with which the bond reacts is dependent on the nature of the alkoxy-group. It is advantageous for the properties (mechanical or with respect to stability) of the chemical structure of the siliconoxide compound and the siliconoxide relief layer that the tetraalkoxysilane and the mono-functionalized trialkoxysilane are incorporated within the siliconoxide compound according to the molar ratio in which they are present within the siliconoxide compound precursor solution. For similar reasoning it is preferred that within the limits of the molar ratio both siliconoxide compound precursors are evenly distributed within the siliconoxide compound. To this end it is expedient to have identical alkoxy-groups in both precursors as much as possible. For the same reason as explained preferably all alkoxy-groups are identical. An advantage of this embodiment is also evident for the method since the chemical reactions will be more controllable, giving better result in less time.

In an embodiment the mono-functionality of the mono-functionalized trialkoxysilane includes a carbon atom with which the mono-functionality is chemically bound to the silicon atom. The mono-functionality is the fourth substituent chemically bound to the silicon atom besides the three alkoxy-groups. It is advantageous if the fourth substituent is chemically bound to the silicon atom with a carbon atom since the Si—C bond is a chemically stable bond, which is substantially inert under the reaction conditions within the siliconoxide compound solution and layer. Preferably the carbon atom is sp3 hybridized and part of a primary alkyl-group, since these Si—C chemical bonds provide good stability. The Si—C bond stability decreases in going from a primary alkyl-group to a secondary alkyl-group to a tertiary-alkyl group. Preferably the alkyl-group is methyl-group since that provides the most stable Si—C bond.

In an embodiment the carbon atom is part of an alkyl-group having less than four carbon atoms. The organic content relative to the inorganic content present within the siliconoxide compound is to a large extent determined by the size (in terms of mass and/or volume) of the alkyl-group. The smaller this alkyl-group is, the higher the inorganic content within the siliconoxide compound in solution and the layer as well as in the final embossed relief layer.

In an embodiment the molar ratio silicon chemically bound to four oxygen atoms/silicon chemically bound to three oxygen atoms and one atom different from oxygen is less than 3/2 within the siliconoxide compound solution and/or the partially dried siliconoxide compound layer. If the ratio becomes larger, inorganic crosslinking through Si—O—Si chemical bonding as described here before becomes too extensive causing the viscosity to rise or the siliconoxide compound to precipitate, therewith preventing the embossing step of the method. Then pattern reproduction is worse or even impossible especially if the concentrations of the siliconoxide compound precursors and the siliconoxide compound is high in order to provide the desired high mass content to the siliconoxide compound solution and layer during the method.

In an embodiment the solvent comprises a first solvent and a second solvent, the first solvent having a higher vapor pressure than the second solvent. By using two solvents separate optimization of the properties of the siliconoxide compound solution and those of the partially dried siliconoxide compound layer is enabled. Independent from the vapor pressure requirement, the first solvent may be used to optimize properties necessary for application of the solution to the substrate surface, while the second solvent may be chosen for increasing the solubility of the siliconoxide compound in the solution. The latter property is advantageous for providing the high inorganic mass content to the siliconoxide compound solution. Preferably, but not necessarily, the first solvent has a higher vapor pressure than the second solvent. This is advantageous since the first solvent, optimizing the spincoating properties, can be removed to leave the second solvent as the main solvent within the partially dried siliconoxide compound layer. Moreover, the second solvent can be used to adjust the drying properties during the sandwiching (embossing) step. Alternatively the solvent may be a mixture of a plurality of solvents in order to achieve the above conditions.

In an embodiment the stamp is permeable for constituents of the partially dried siliconoxide compound layer to accomplish further drying during the sandwiching step. With permeable it is meant that the stamp is permeable to small molecules such as solvent molecules or small products from the reaction for forming the silicon oxide compound. In effect the stamp must be permeable to all constituents of the siliconoxide compound solution and layer except the siliconoxide compound itself and the siliconoxide compound precursors. Preferably, the siliconoxide compound precursors have substantially reacted away to form the siliconoxide compound. In that case the relatively small siliconoxide compound precursors are not present in the solution when it is brought in contact with the permeable stamp during the sandwiching step of the method. Hence a high degree of conversion into the siliconoxide compound is preferred as provided by the invention.

In an embodiment the relief layer is subjected to a heating step for sintering of the siliconoxide. After embossing, removing of all solvent and reaction products and the relief layer comprises a siliconoxide that still have organic content, the organic content stemming from the mono-functionality of the trialkoxysilane. In order to remove this organic content a heating step may be performed which also densities the material of the relief layer. The relief layer as obtained by the method before the heating step comprises relatively little of the organic content and as a consequence shrinking during this step is reduced substantially. This results in size and shape fidelity of the relief layer features after the heating step. It is noted that the temperature of the heating step is dependent on the nature of the mono-functionality stemming from the trialkoxysilane.

In a second aspect of the invention the object is achieved by providing a relief layer according to claim 13 or 14.

The Si—C chemical bond is chemically and thermally relatively stable. Hence, the relief layer is relatively stable making it suitable for use within numerous applications without having to remove the organic group.

In an embodiment of the relief layer the molar ratio silicon atoms chemically bound to four oxygen atoms/silicon atoms chemically bound to three oxygen atoms and one carbon atom within the siliconoxide is at least 2/3. In this embodiment, the siliconoxide has a relatively high siliconoxide mass content as the number of organic groups chemically bound to the siliconoxide of the relief layer is relatively small. The higher the ratio the lower the organic mass content within the relief layer. Preferably the ratio is higher than 1. In that case shrinkage of the relief layer during a heating step for extruding the organic content is also minimized. This minimum shrinkage is advantageous for shape fidelity of the relief layers if a heating step for sintering is employed.

In an embodiment of the relief layer the carbon atom is part of an organic group with which the silicon atom is connected to at least one other silicon atom of the siliconoxide compound, the organic group being chemically bound to the at least one other silicon atom. Instead of inorganic crosslinking, the siliconoxide of the relief layer may have been solidified by organic crosslinking. In that case a group obtainable by a crosslinking reaction according to the embodiment is incorporated within the siliconoxide. The organic group could be a group activated to crosslink under influence of a photochemical reaction initiated by actinic radiation such as for example UV radiation.

In an embodiment of the relief layer the carbon atom is part of any one of a methyl-group, ethyl group or propyl-group. Alkyl groups form the most stable Si—C chemical bonds. Hence stability of the relief layer comprising such groups is relatively high. Thus, a relief layer incorporating methyl groups as the alkyl groups is stable up to 400° C. in ambient atmosphere, therewith extending its field of application towards those requiring resilience against such temperatures. An ethyl-group provides stability up to approximately 300° C. In addition, the mass and volume of these small alkyl groups cause that the organic mass and volume content of a relief layer of siliconoxide having these alkyl-groups is relatively low. This is advantageous in terms of shrinkage of the layers when subjected to heating to remove these organic alkyl-groups.

In an embodiment of the relief layer the features of the relief layer have a shape conformal to the corresponding complementary feature within the template relief surface. Due to the high inorganic mass content within the relief layers, they can be prepared with little shrinkage and shape fidelity is maintained. Especially rounding of corners at the footprint of protrusions of features of the relief layer occurring during solidification of the relief layer is substantially reduced or even absent in a relief layer according to the invention.

In an embodiment the relief layer is used as an etch mask. The stability of the relief layer and its high inorganic mass content and low porosity make it suitable for use in etching processes requiring harsh conditions such as Reactive ion etching or aggressive wet etching. Hence the layers can be applied as etch masks or hard masks during for example semiconductor manufacturing where such etching is extensively used.

In an embodiment the relief layer is used for the manufacture of a semiconductor device, optical device or micro-mechanical device having a functional layer incorporating the relief layer. The stability of the layer based on its structure makes it useful to be implemented as a functional layer within such devices. This is also true for relief layers that can provide specific other functionalities besides the improved strength and integrity.

BRIEF DESCRIPTION OF THE DRAWINGS

These and other aspects of the invention are further elucidated by the description here below with reference to the figures (not drawn to scale except for FIG. 3 and FIG. 5) in which.

DETAILED DESCRIPTION OF THE INVENTION

Figure 1A:
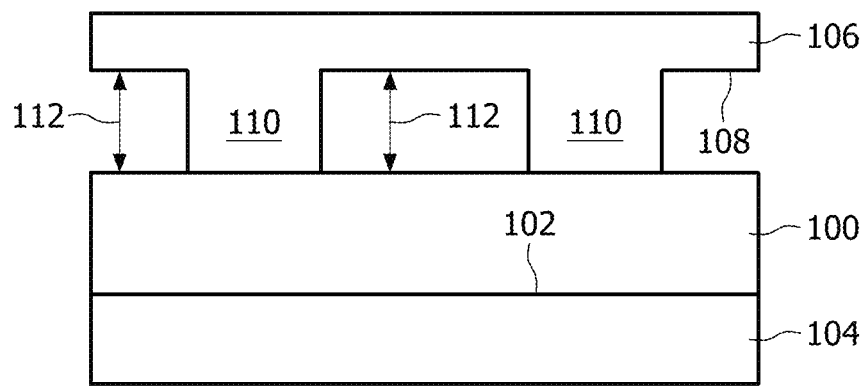
FIGS. 1A to D represent an embossing process according to the prior art.
Figure 1B:
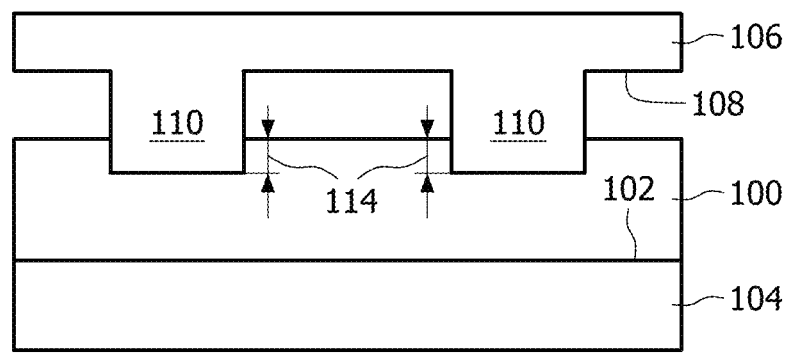
Figure 1C:
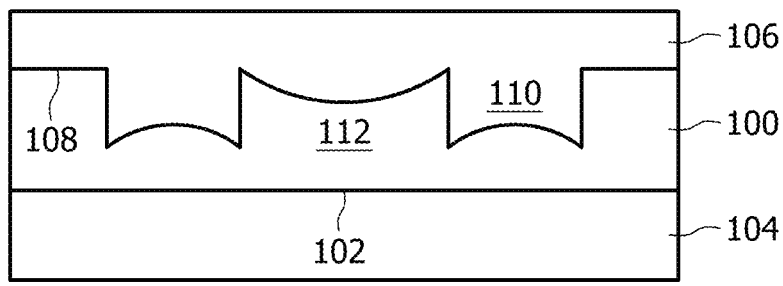

In the description and figures, like parts have like numerals. In FIGS. 1A to 1C a sequence of 3 stages of an embossing process shows inadequate relief pattern feature reproduction. In the first stage of FIG. 1A is shown a glass like, partially dried siliconoxide compound layer 100 provided on a surface 102 of a substrate 104 just prior to embossing with a stamp 106 having a stamping surface 108 comprising a relief pattern made up of protrusions 110 and depressions 112. The embossing is done in a sandwiching step in which a stamp is used that is permeable for gases and/or liquid constituents of the partially dried siliconoxide compound layer. During this embossing or sandwiching process liquid constituents are removed from the partially dried siliconoxide compound layer into and possibly through the permeable stamp. The result is that as shown in the next stage of FIG. 1B, part of the partially dried siliconoxide layer has been able to flown into the depression 112, thereby partly filling the depression 112. The extent to which this is possible is determined by the flow properties of the material of the partially dried siliconoxide compound layer during that part of the embossing process wherein the stamp is inserted into this layer. If the partially dried layer is not formable enough, i.e. too viscous or glass like, the depression 112 is not entirely filled or is filled but deformed as shown in FIG. 1C. The deformation is due to too little mass flow into the depression 112 within the solidification time window. It is further noted that viscosity increases during the embossing process due to the further drying which starts from the moment that stamp and partially dried siliconoxide compound layer have been brought in contact as in FIG. 1A. The end result is that the relief pattern of the stamp is not adequately reproduced within the sol-gel layer.

Figure 1D:
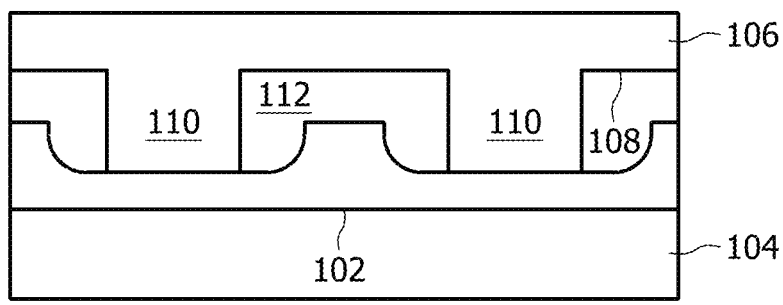

An additional problem to the one described here before is explained with FIG. 1D. The problem is related to a situation (not shown) wherein a depression 112 in the template relief surface 108 has been completely filled with material from the partially dried siliconoxide compound layer 100 without deformation of the shape (for example if the stamp is a non-flexible stamp). The layer 100 has however a too low inorganic or in this case siliconoxide compound mass content. Consequently, further drying during the method then results in shrinkage of the material filling the depression 112 as shown in FIG. 1D. The shrinkage not only causes size reduction of the feature, but also deformation of the feature.

The method of the invention combines a process for embossing with the use of specific silicon compound materials that can be embossed without showing the aforementioned deficiencies.

In a method according to the invention a number of siliconoxide compound solutions according is prepared according to examples 1 to 5.

EXAMPLE 1

A first siliconoxide compound solution according to the invention is prepared by mixing together 8 gram of Ludox™ TM-50, comprising 50 weight % silica nanoparticles having a particle diameter inbetween 20 nm and −40 nm in water with 1.2 gram of formic acid under stirring. Subsequently, 0.9 gram of Methyltrimethoxysilane (MTMS) is added and the resulting mixture stirred at room temperature for 15 minutes. An additional 6.9 grams of MTMS is added under stirring and the resulting solution is left to stand for 30 minutes at room temperature. Finally, 1.7 gram of ethyleneglycolmonobutylether is added. The PH of the resulting silicon compound solution as measured with litmus paper is in between 3.5 and 4.5.

EXAMPLE 2

A second silicon compound solution according to the invention is prepared by mixing together the silicon compounds precursors MTMS and tetramehoxysilane (TMOS) in a molar ratio as given in table I. In a second step 1M formic acid in water is added to the mixture to an amount of 1 mole water per mole of methoxy-groups of the total added amount of silicon compound precursors. The resulting mixture is allowed to react, undergoing hydrolysis and condensation for period of 10 min. to 30 min. at a temperature between 20° C. and 30° C. in order to form a siliconoxide compound. Then to the mixture is added n-propanol such that the resulting silicon compound solution contains a total Silicon atom concentration of 0.8 mol per kilogram solution. In a final step, water is added to the mixture to an amount of 9 times the total silicon atom content in moles to obtain the silicon compound solution according to the invention.

TABLE I

| Experiment | TMOS mole | MTMS Mole | Weight % CH3 in relief layer | Volume % CH3 in relief layer |
|---|---|---|---|---|
| I | 40 | 60 | 14.0 | 26.4 |
| II | 50 | 50 | 11.8 | 22.8 |
| III | 67 | 33 | 8.0 | 16.1 |

Within the method of this example the extent of gel formation within the silicon compound is dependent on the gel period and the temperature. Therefore, these parameters may be used to set the desired extent of crosslinking. For example, the temperature may be higher than the one used in example 1, but then the gel-period must be shortened. Typically, a 10 degree increase of gel temperature requires shortening of the gel-period by a factor of 2. Suitable gel conditions are a temperature of 40° C. during 5-10 min. or a temperature of 50° C. for 1 min.

EXAMPLE 3

A third siliconoxide compound solution according to the invention is prepared by mixing together the silicon compounds precursors MTMS and TMOS in a molar ratio as given in table I. Then n-propanol is added to dilute the mixture before in a second step 1M formic acid in water is added to the mixture to an amount of 1 mole water per mole of methoxy-groups of the total added amount of silicon compound precursors. After the addition the resulting mixture is allowed to react, undergoing hydrolysis and condensation for period of 10 min. to 60 min. at a temperature between 20° C. and 30° C. in order to form a siliconoxide compound. In a third step additional n-propanol is added such that the resulting siliconoxide compound solution contains a total silicon atom concentration of 0.8 mol per kilogram solution. In a final step water is added to the mixture to an amount of 9 times the total silicon atom content in moles within the mixture to obtain the siliconoxide compound solution according to the invention.

The method of this example resembles the one of example 1, but differs in the order of which formic acid and dilution with n-propanol is performed. The method is advantageous since the rate of the inorganic crosslinking reaction between the silicon precursor compounds and/or the siliconoxide compound is lowered due to lower concentration of the silicon precursor compounds TMOS and MTMS during the gel-period as compared to the method of example 1. The slower rate gives rise to lager time window and/or temperature budget for the formation of the siliconoxide compound according.

EXAMPLE 4

A fourth siliconoxide compound solution according to the invention is prepared according to the method of example 2 or 3, whereby the MTMS is replaced by methacryloxypropyltrimethoxysilane (MEMO). MEMO is siliconoxide precursor compound having an organic functionality that can be crosslinked using actinic radiation such as UV irradiation. It belongs to the group of photoinitiators.

EXAMPLE 5

A fifth siliconoxide compound solution according to the invention is prepared by adding to any of the siliconoxide compound solutions as obtained by examples 2, 3 or 4, 1 to 4 weight % of a second solvent being for example 1,2-propanediol, ethyleneglycol, ethyleneglycolmonobutylether or 2-(2-butoxyethoxy)ethylacetate or a mixture of these. Generally a minimum 1 weight % of such a solvent is necessary for a siliconoxide compound solution having 0.38 Mol Silicon atoms per kilogram solution.

In the examples described alkoxysilanes have been used as the siliconoxide precursor compounds for the preparation of the siliconoxide compound according to the invention. This is however not necessary as chemical groups other than alkoxy-groups can be used during the formation of the siliconoxide compound as long as these groups can be removed from the silicon atoms by hydrolyses reaction during the method. One requirement for the groups to be usable during the method regardless of whether these are alkoxy-groups or other groups is that after hydrolyses their reaction products (for example alcohols when alkoxy-groups are used) can be removed from the siliconoxide compound layer by for example evaporation or adsorption or diffusion through the stamp. Thus accordingly, the methoxy-groups of either or both of the TMOS and MTMS may be replaced by ehoxy-groups as in tetraethoxysilane (TEOS and a mono-functionalized-triethoxysilane). Also mixtures of tetraalkoxysilanes or trialkoxysilanes can be used.

Furthermore, the use of formic acid in both examples is not critical; any weak acid can be used. Weak acids include but are not limited to organic acids such as for example acetic acid, propionic acid, maleic acid, citric acid or oxalic acid. Those skilled in the art will be able to think of many more weak acids that can be used. Weak acids are preferred over strong acids because the extent of inorganic crosslinking in the siliconoxide compounds is more difficult to control when strong acids are used. The acids preferably are soluble in the mixtures to be prepared.

In the examples n-propanol is used as the solvent of the siliconoxide compound solutions. Although this may be advantageous with respect to spincoating of the solutions on a substrate, other solvents can be satisfactorily used provided that they are able to dissolve the siliconoxide compound within the partially dried siliconoxide compound layer. Other suitable solvents include for example isopropanol, isomers of butanol, esters or ethers or mixtures of these. Preferably, the solvent used is able to diffuse into or through the permeable stamp in order to effectuate further removal of the solvent during the sandwiching step. Therewith, the solvent will influence the drying behavior and solidification time of the partially dried siliconoxide compound layer during embossing.

In order to decouple the requirements of the solvent with respect to properties advantageous for application of the siliconoxide compound solution to the substrate and the, partial drying and further drying, the solvent can be adapted to comprise multiple solvents, such as for example a first and second solvent. In the example 5 the solvent comprises a first solvent n-propanol and up to four weight percent of 1,2-propane-diol and/or other second solvents. These second solvents can be used to tailor the properties of the solution with respect to application, drying, and solubility of the siliconoxide compound. Preferably the second solvent does not react with the siliconoxide compound, therewith extending the lifetime of the siliconoxide compound solution, and is the main solvent left after further drying. To this end it must have lower vapor pressure than the first solvent. In the last case the second solvent preferably dissolves the siliconoxide compound to high concentration and be easy to remove via the stamp.

It is noted that preferably all additives of the siliconoxide compound solution can be removed from the siliconoxide compound layer either by evaporation or through the permeable membrane. This holds thus for hydrolysis reaction products, as well as the weak acid and the solvents used.

In a next step of one embodiment of the invention a siliconoxide compound solution prepared as described by example 5 wherein the solution comprises 2 weight percent of 1,2-propanediol is applied to the surface of a clean silicon wafer by spincoating. It is noted that without departing from the invention, the substrate may be any substrate desired such as inorganic substrates including glass and quartz or organic materials such as for example polymers and the method of application of the solution may be chosen according to will. Frequently used are spincoating, dipcoating, jet printing or printing. In the present embodiment the siliconoxide compound solution is spincoated at a rotation rate between 300 and 2000 rpm for 1 to 3 minutes. Other rates and spincoating times may be used to control layer thickness and quality if desired.

The obtained partially dried siliconoxide compound layer is sandwiched between the substrate surface and a stamp made of silicone rubber by gently placing the stamp in the partially dried layer as shown in FIG. 2. The embossing took place at room temperature during a period of 30 minutes. Alternatively, shorter periods can be used which can be effectuated by either raising the temperature or using a solvent with higher diffusion rate in the stamp material. In addition more reactive chemistry within the siliconoxide compound solution can be used to this end.

Figure 2A:
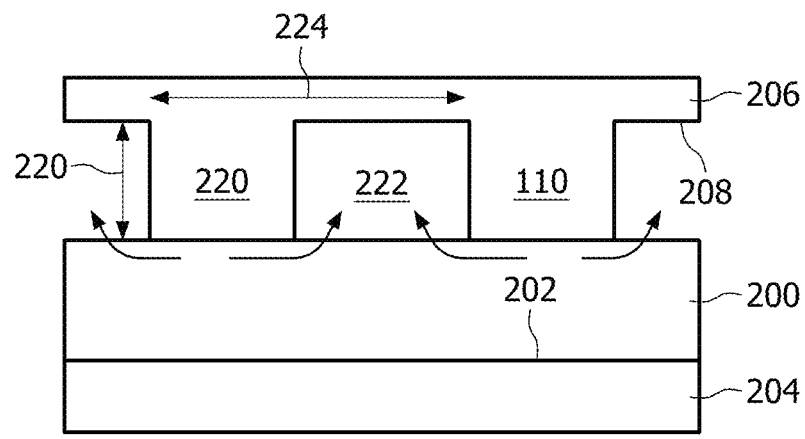
FIGS. 2A to D represent an embossing process according to the invention
Figure 2B:
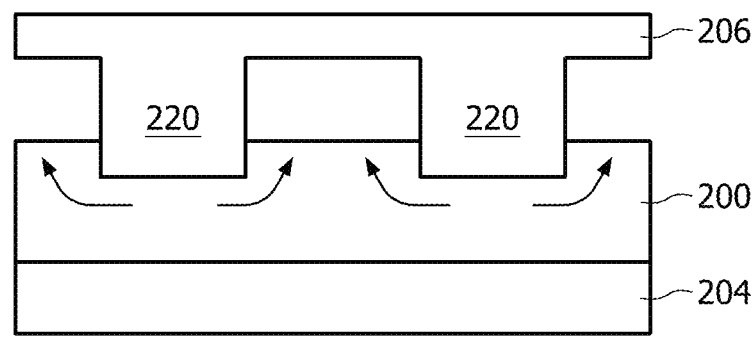
Figure 2C:
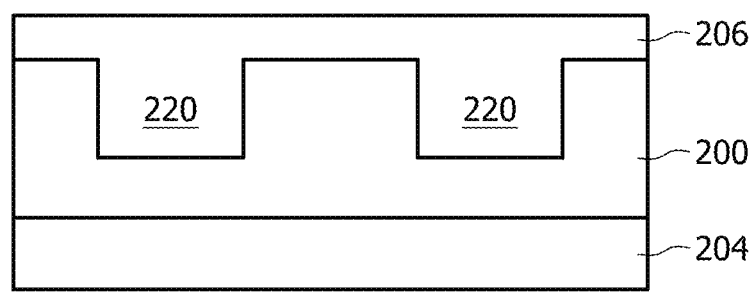
Figure 2D:
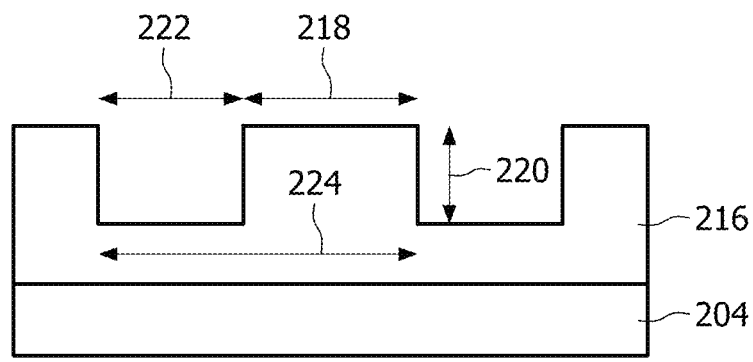

In the present embodiment the stamp comprises a template relief pattern including a plurality of parallel elongated protrusions forming a grating relief pattern as shown in FIG. 3 which have a cross section as shown in FIG. 2D. The gratings have a pitch 224 being defined as the repeating unit of the grating perpendicular to the direction in which the protrusions extend. The pitch therewith is equal to the sum of the width of a protrusion 218 and the width of a depression 222 in the relief layer (FIG. 2D).

During sandwiching, the partially dried siliconoxide compound layer is molded according to the template relief pattern whereby the optimized viscosity gives a good fill of the depressions 112 in the template relief pattern. The arrow in FIGS. 2A and 2B depict the flow of layer material necessary to fill the depression 112. At the same time the partially dried siliconoxide compound layer is further dried. The further drying results in progressive inorganic cross-linking such as in this case Si—O—Si chemical bonding by further hydrolysis and condensation within the siliconoxide compound. In addition, during the drying all solvents and hydrolysis reaction products as well as catalysts involved in the hydrolysis are removed as much as possible through the permeable silicone rubber stamp 206. As a result, the partially dried siliconoxide compound layer 200 is transformed into a solidified siliconoxide layer 216 molded such as to comprise a relief pattern complementary to the template relief pattern 208 after removal of the silicone rubber stamp as shown in FIG. 2D.

Figure 3A:
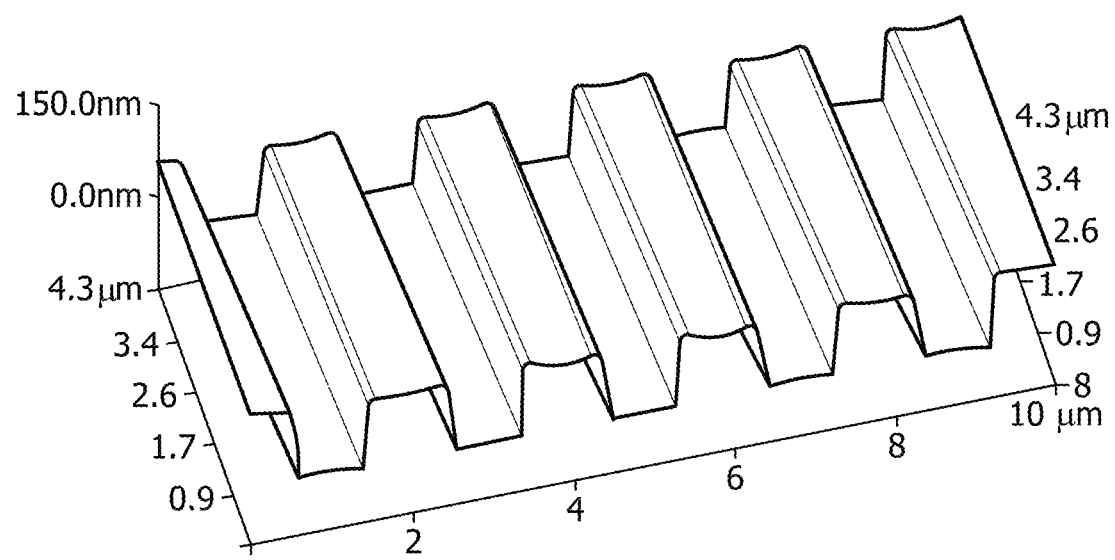
FIGS. 3A to D represent a number of AFM topology graphs and topology graphs produced by using a light interferometer of relief layers obtained according to the invention.
Figure 3B:
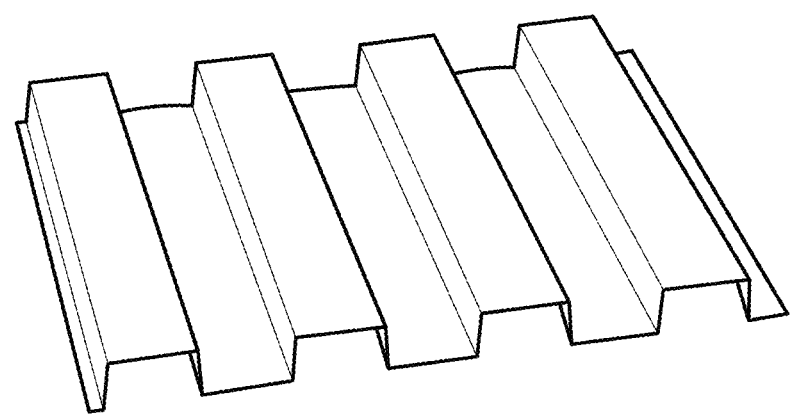
Figure 3C:
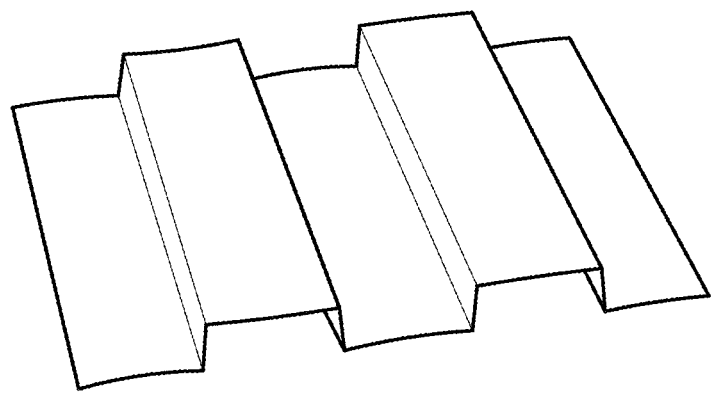
Figure 3D:
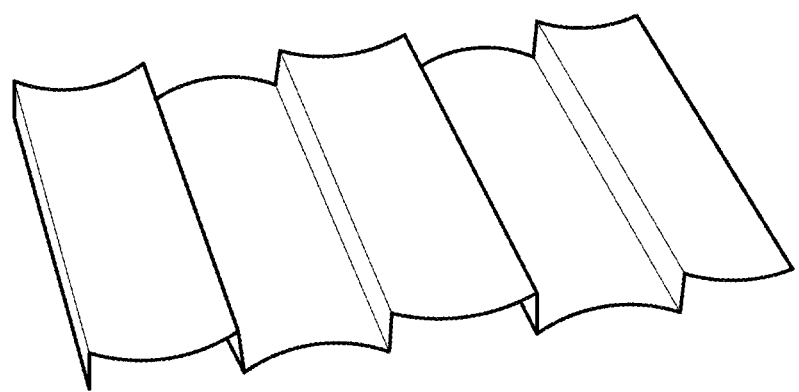

FIGS. 3A to 3D show relief layers as obtained with the method according to the invention using a solution as obtained by example 2, the relief layers having a pitch of 2 micrometer in FIG. 3A, a pitch of 64 micrometer in FIG. 3B, a pitch of 128 micrometer in FIG. 3C and a pitch of 256 micrometer in FIG. 3D. In all cases the height 220 (FIG. 2A) of the protrusions is 100 nm. The template relief pattern in all cases comprises square features a cross section is depicted in FIG. 2D.

The shape fidelity, i.e. feature reproduction is excellent up to a pitch of at least 128 micrometer, which means an aspect ratio defined as the height of the depression over the width of depression over of 1/640. Flowability problem is thus adequately suppressed by the method of the invention. In this particular case the flowability influence of the partially dried siliconoxide compound layer material on the shape becomes only evident with an aspect ratio of 1/1280 as in FIG. 3D. The solution may be further tuned to decrease the aspect ratio range by using more of the second solvent with a low vapor pressure or decreasing the crosslink density in the starting solution. Also increasing the thickness of the residual layer thickness will aid in less flow resistance, thus better feature fidelity.

The angles in the surface of the gratings of FIG. 3A to FIG. 3C are well reproduced from the template relief pattern. Shape deformation due to shrinkage, as described here above with respect to foe example FIG. 1D is not observed. This is due to the fact that the partially dried siliconoxide compound layer has a high concentration of siliconoxide compound and the siliconoxide compound has a high degree of inorganic Si—O—Si crosslinking.

As evidenced by the results, the method of the invention is applicable for fabrication of relief layers with a wide geometric variation. Features having dimensions ranging from nanometers to hundreds of micrometers with aspect ratios down to 1/1280 may be prepared with one type of solution.

Figure 4A:
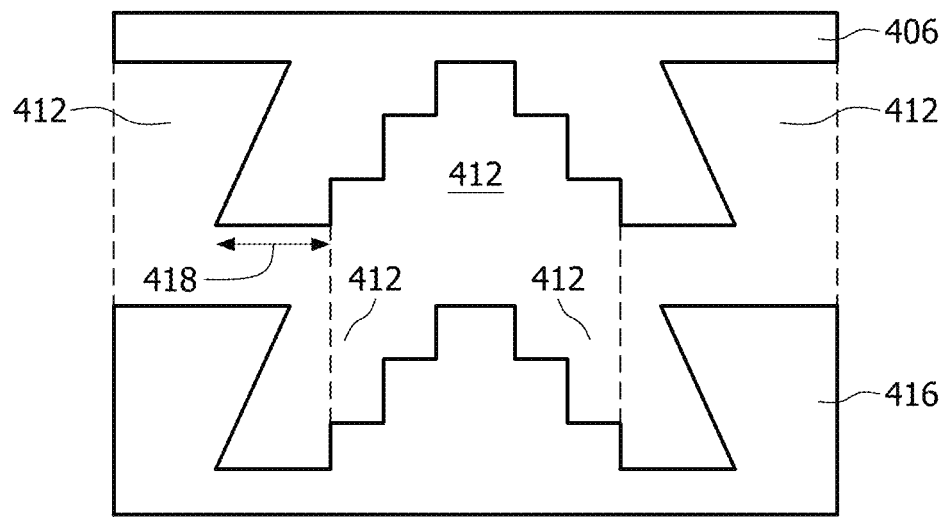
FIGS. 4 and B represent a stamp having template pattern features with irregular shapes and corners.
Figure 4B:
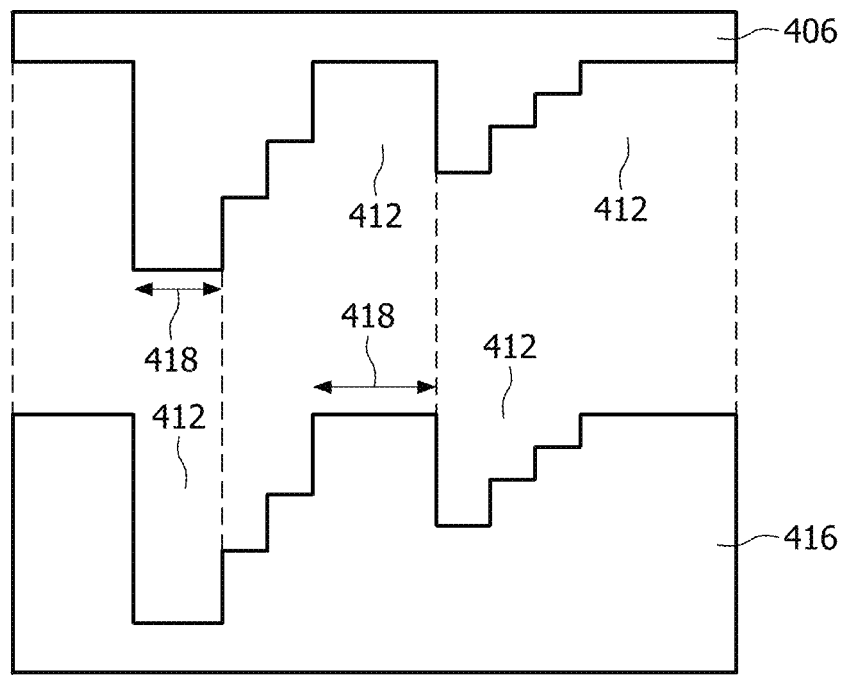

Thus, one example of a stamp 406 having a shape more complicated or more irregular than square is shown in FIG. 4A. Feature shapes having corners will particularly benefit from the improved formability of the partially dried siliconoxide compound layer and thus the embossing method of the invention with respect to reproducibility of these features. Also the depressions 412 in stamp patterns and relief layer patterns having small dimensions 418 for example in the micrometer or nanometer range or still smaller will benefit for the same reasons.

Fragile stamp patterns or pattern features will be better reproduced with the method of the invention. Such fragile stamp pattern features include for example those having dimensions such as height 220 and width 220 in the micrometer range or nanometer range or still smaller. Protrusions having high aspect ratio i.e. having larger height than width are better reproduced. Likewise, for depressions in the template relief pattern that have low aspect ratio as describe here before with respect to FIG. 3.

Fragile stamps also include flexible stamps, rubber stamps made from organic materials (elastic or inelastic) such as for example polydimethylsiloxane (PDMS; a material often used for flexible stamp embossing) or stamps made of brittle material including for example permeable porous stamps. The rubber and permeable porous stamps may be preferred in the method for providing the permeability to air and/or gas described here above. Here porous is not meant to include porosity that enables the inflow of siliconoxide compound material during embossing. The method is also beneficial in terms of lifetime or defect control in the pattern. The stamp pattern is less likely to damage and this is beneficial in terms of service life of stamps and therewith cost as well as for the quality of the relief layers to be prepared.

The combination of relief layer composed of sol-gel materials of substantially or entirely inorganic nature as for example used in the present invention and a rubber stamp such as the silicone stamp used in the invention is advantageous since in the case that the stamp gets contaminated with the relief layer material, for example material left after peeling of the stamp from the substrate with relief layer, it can be conveniently cleaned using chemicals for removal of the sol gel materials. Such materials include the usual materials for dissolving and or chemically de composing the sol gel material such as for example bases like sodium hydroxide solutions or acids hydrofluoric acid.

The relief layer as obtained by the method has several advantages. It comprises low organic content and low porosity due to high inorganic siliconoxide mass content. Hence the layer is robust and can be used for multiple applications as will be elucidated further below.

One advantage is the presence of the organic content in the form of an alkyl-group. Such groups are thermally relatively stable. Thus, a relief layer incorporating for example ethyl-groups is stable up to approximately 300° C. in ambient conditions. If the alkyl-group is a methyl-group, stability increases up to temperatures of 400° C. Hence the invention provides a silicon oxide layer that is patterned at ultimately high resolution, is stable at high temperatures, and can be obtained without heating, or irradiating and using cheap equipment.

The relief layer has another important advantage. From Table I it can be seen that the relief layer obtained from a method using a solution according to example 1 and exp I in table I comprises an organic mass content of in between approximately 10 to 20% depending on the molar ratio of TMOS/MTMS used during the method. The mass content is calculated from the molar ratio TMOS/MTMS which is similar to the molar ratio of silicon atoms bound to four oxygen atoms/silicon atoms chemically bound to three oxygen atoms and one carbon atom of a methyl-group. Assuming a density of the organic group of 1 and a density of the silicon oxide of 2.2, the volume fraction of organics can be calculated by dividing the quotient of the organic mass and the organic density by the sum of the same quotient and the quotient of the inorganic mass and the inorganic mass density. The volume fraction is also shown in Table I. The volume fraction gives an indication towards tendency of shrinkage upon removal of the residual organic content. The shrinkage is low for the relief layer obtained by the method of the invention, i.e. in case of the materials of table I the shrinkage will be less than 20%.

Figure 5A:
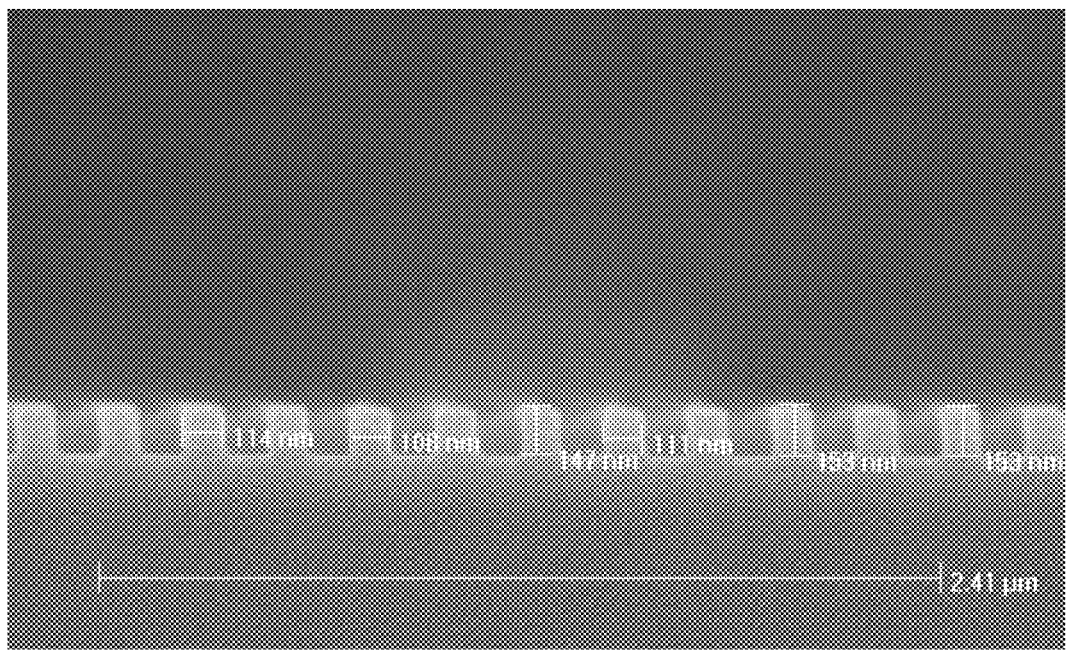
FIGS. 5A and B represent electronmicrographs of cross sectional views of relief layers obtained according to the invention before and after additional heating.
Figure 5B:
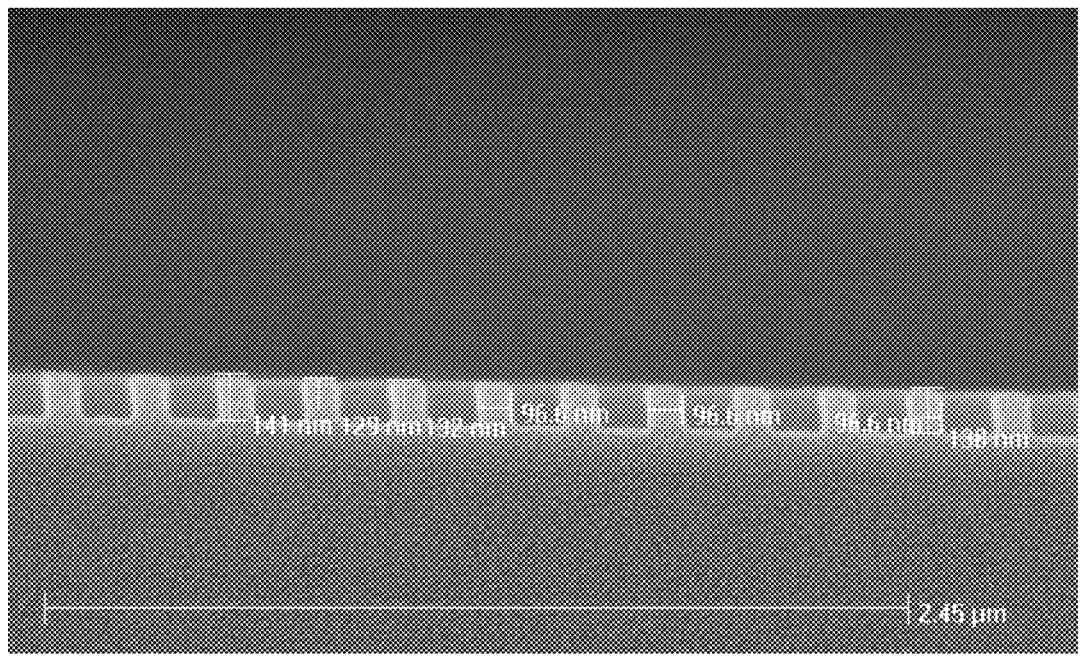

Removal of the organic content can be effectuated during a sintering step heating the relief layer to temperatures higher than the temperature above which the Si—C bond is no longer stable towards oxidation or thermal cracking. FIG. 5A shows the result of a grating having a pitch of 240 nm and a height of 150 nm obtained by embossing at room temperature according to the method using a solution prepared by example 2. FIG. 5B shows the same grating after heating to 1040° C. After heating the protrusion has shrunk in height by 12% and shrunk in width by approximately 13%.

For comparison a relief layer having been made using a solution according to example 1 comprises 11.0 weight % of organics in the form of methyl-groups. However, if the methyl group is a propyl-group the weight % of organics within the structure in the form of propyl-groups chemically bound to silicon atoms is already 27.7 weight %.

In an embodiment, the drying step and solidification of the partially dried siliconoxide compound layer is different from the previously described embodiment. In this case a UV crosslinkable group is incorporated in the siliconoxide compound as for example the MEMO example shows. In that case during sandwiching the layer is exposed to actinic radiation suitable for crosslinking to solidify the layer. Then further drying or solidification through inorganic crosslinking is continued during sandwiching by removal of solvent through the stamp, or it is continued after removing the stamp such that drying is effectuated by evaporation. This could be advantageous if the stamp is not permeable for the layer constituents that need to be removed, or when its capacity for these constituents is too low causing throughput problems. The organic crosslinking in this case provides the integrity of the layer needed to leave its relief pattern intact upon removal of the stamp without further drying.

The relief layer according to the invention before or after sintering having the properties as described is therewith suitable for numerous applications in electronic, micromechanical or optical devices or their manufacture.

The characteristics of the relief layers as obtained by the method both before sintering and after sintering enable them to be used reliably as pattern masks for etch processes. The high inorganic mass content make the layer resilient against harsh etch conditions. The method of the invention in combination with the properties of the relief layer itself enable hardmasks to be obtained without having to etch an inorganic layer using a photoresist and imprinting or lithography.

Where the relief layer is used as a functional layer of a device its stability is of importance and advantageous. The ability to functionalize through for example the nanoparticles is of advantage in this respect too.

The invention claimed is:

1. A silicon oxide compound solution comprising a silicon oxide compound with a degree of Si—O—Si cross-linking,
   wherein silicon atoms of the silicon oxide compound comprise:
     a first silicon atom chemically bound to four oxygen atoms; and
     a second silicon atom chemically bound to three oxygen atoms and one atom different from an oxygen atom, wherein the chemical bond between the second silicon atom and the one atom different from oxygen is not capable of forming an Si—O—Si chemical bond,
   wherein the silicon oxide compound solution is a mixture of a silicon oxide compound precursor, at least one monofunctionalized trialkoxysilane and an aqueous acid solution that is a weak acid,
   wherein the silicon oxide compound solution further comprises a first solvent and a second solvent,
   wherein a vapor pressure of the first solvent is higher than that of the second solvent, and
   wherein the second solvent comprises at least one of: 1,2-propanediol; or ethylene glycol.

2. The silicon oxide compound solution according to claim 1, wherein the weak acid comprises any one of formic acid, acetic acid, propionic acid, maleic acid, citric acid, and oxalic acid.

3. The silicon oxide compound solution according to claim 2, wherein the weak acid comprises formic acid or acetic acid.

4. The silicon oxide compound solution according to claim 1, wherein the first solvent comprises n-propanol, isopropanol, an isomer of butanol, ester or ether, wherein the ester or ether has a vapor pressure that is higher than that of the second solvent.

5. The silicon oxide compound solution according to claim 1, wherein the silicon oxide compound precursor comprises a tetraalkoxysilane.

6. The silicon oxide compound solution according to claim 1, wherein a monofunction of the monofunctionalized trialkoxysilane comprises a carbon atom that is chemically bound to the silicon atom.

7. The silicon oxide compound solution according to claim 6, wherein the carbon atom is a part of an alkyl group having less than four carbon atoms.

8. The silicon oxide compound solution according to claim 7, wherein the carbon atom is sp3 hybridized and is a part of a primary alkyl group.

9. The silicon oxide compound solution according to claim 8, wherein the primary alkyl group comprises a methyl group.

10. The silicon oxide compound solution according to claim 6, wherein alkoxy group in at least one of tetraalkoxysilane and the monofunctionalized trialkoxysilane comprises a methoxy group or ethoxy group.

11. The silicon oxide compound solution according to claim 1, wherein the molar ratio of silicon chemically bound to four oxygen atoms/silicon chemically bound to three oxygen atoms and one atom different from oxygen is less than 3/2.

12. The silicon oxide compound solution according to claim 11, wherein the molar ratio is greater than 2/3.

13. The silicon oxide compound solution according to claim 1, wherein the silicon oxide compound solution comprises nanoparticles.

14. The silicon oxide compound solution according to claim 13, wherein the nanoparticles comprise silicon oxide.

15. A method of using the silicon oxide compound solution according to claim 1, the method comprising forming a layer to be embossed in a method of embossing, the silicon oxide compound solution comprising the silicon oxide compound with the degree of Si—O—Si cross-linking,
   wherein silicon atoms of the silicon oxide compound comprise:
     the first silicon atom chemically bound to four oxygen atoms; and
     the second silicon atom chemically bound to three oxygen atoms and one atom different from the oxygen atom, wherein the chemical bond between the second silicon atom and the one atom different from oxygen is not capable of forming the Si—O—Si chemical bond,
   wherein the silicon oxide compound solution is the mixture of a silicon oxide compound precursor, the at least one monofunctionalized trialkoxysilane and the aqueous acid solution that is the weak acid,
   wherein the silicon oxide compound further comprises the first solvent and the second solvent,
   wherein the vapor pressure of the first solvent is higher than that of the second solvent, and wherein the second solvent comprises at least one of:
1,2-propanediol; or
ethylene glycol.

16. The silicon oxide compound solution according to claim 1, wherein the second solvent does not include ethylene glycol.

17. The silicon oxide compound solution according to claim 1, wherein the second solvent does not include:
1,2-propanediol.

18. The silicon oxide compound solution according to claim 1, wherein the second solvent excludes:
ethylene glycol mono butyl ether; and
2-(2-butoxyethoxy)ethyl acetate.

19. The silicon oxide compound solution according to claim 1, wherein the second solvent further comprises at least one of ethylene glycol mono butyl ether or 2-(2-butoxyethoxy)ethyl acetate.

20. A method of manufacturing the silicon oxide compound solution according to claim 1 comprising the silicon oxide compound with the degree of Si—O—Si cross-linking, the method comprising:
mixing the silicon oxide compound precursor and the at least one monofunctionalized trialkoxysilane to obtain the mixture; and
reacting the mixture with the aqueous acid solution that is the weak acid in order to form the silicon oxide compound,
wherein silicon atoms of the silicon oxide compound comprise:
the first silicon atom chemically bound to four oxygen atoms; and
the second silicon atom chemically bound to three oxygen atoms and one atom different from the oxygen atom, wherein the chemical bond between the second silicon atom and the one atom different from oxygen is not capable of forming the Si—O—Si chemical bond,
wherein the silicon oxide compound solution further comprises the first solvent and the second solvent,
wherein the vapor pressure of the first solvent is higher than that of the second solvent, and
wherein the second solvent comprises at least one of:
1,2-propanediol; or
ethylene glycol.

* * * * *